United States Patent [19]

Robinson et al.

[11] Patent Number: 4,836,138

[45] Date of Patent: Jun. 6, 1989

[54] HEATING SYSTEM FOR REACTION CHAMBER OF CHEMICAL VAPOR DEPOSITION EQUIPMENT

[75] Inventors: McDonald Robinson, Paradise Valley, Ariz.; Albert E. Ozias, Aumsville, Oreg.

[73] Assignee: Epsilon Technology, Inc., Tempe, Ariz.

[21] Appl. No.: 63,409

[22] Filed: Jun. 18, 1987

[51] Int. Cl.$^4$ .............................................. B05C 11/00
[52] U.S. Cl. .................................. 118/666; 118/52; 118/500; 118/725; 427/55; 427/255.5; 427/314
[58] Field of Search ................. 118/724, 725, 666, 52, 118/500; 427/55, 255.5, 314

*Primary Examiner*—Bernard Pianalto
*Attorney, Agent, or Firm*—Cahill, Sutton & Thomas

[57] ABSTRACT

A heating system for use in chemical vapor deposition equipment of the type wherein a reactant gas is directed in a horizontal flow for depositing materials on a substrate which is supported in a reaction chamber on a susceptor which is rotatably driven for rotating the substrate about an axis which extends normally from its center. The heating system works in conjunction with a special heat sensing arrangement and includes an upper heating element assembly, a lower heating element assembly and a heat concentrator mechanism which interact to provide rapid temperature build-up at the beginning of a processing cycle, rapid temperature attenuation at the end of a processing cycle and a controlled flat temperature profile during the processing cycle.

37 Claims, 4 Drawing Sheets

HEATING SYSTEM FOR REACTION CHAMBER OF CHEMICAL VAPOR DEPOSITION EQUIPMENT

BACKGROUND OF THE INVENTION

1. Field of the Invention

This invention relates in general to heating systems for use with the reaction chambers of chemical vapor deposition equipment, and more particularly to a heating system for use with a horizontal gas flow reaction chamber having rotatable susceptor for supporting a single substrate.

2. Discussion of the Related Art

In the art of manufacturing semiconductor devices, it has long been a practice to employ chemical vapor deposition equipment for depositing various materials, on substrates at high temperatures. Basically, chemical vapor deposition equipment includes a reaction chamber which is configured for containing and controlling the flow of a reactant and carrier gas therethrough. A base, which is commonly referred to in the art as a "susceptor", is located in the reaction chamber for supporting the substrates upon which the material is to be deposited and the reaction chamber, the susceptor and the substrate are heated to a desired reaction temperature.

A particular type of prior art structure is disclosed in U.S. Pat. No. 3,836,751 by Emmett R. Anderson which issued on Sept. 17, 1974. In the Anderson patent, a slab-like susceptor is fixedly supported in a horizontally disposed reaction chamber for supporting a multiplicity of substrates, or wafers. A first radiant heat source is located above the reaction chamber and includes a plurality of elongated radiant heating elements which are disposed in parallel relationship with each other so as to lie along one horizontal axis above the reaction chamber. A second radiant heat source is located below the reaction chamber and similarly includes a plurality of elongated radiant heating elements which lie along a horizontal axis which is below the reaction chamber and is transverse to the axis of the first radiant heat source. Thermal sensors are located in the fixed planar susceptor for monitoring the temperatures in various regions of the susceptor with the regions being disposed along angularly displaced axes which coincide with the axes of the first and second radiant heating sources but are located within the reaction chamber. The thermal sensors produce signals indicative of the temperatures sensed in their respective regions and in conjunction with appropriate circuits and controls, adjust the temperatures in the various regions to produce a substantially flat temperature profile in the susceptor.

While simultaneous deposition of materials on a multiplicity of substrates is desirable from a manufacturing standpoint, it has some drawbacks from a quality standpoint.

The first problem associated with multi-substrate processing in general, and with the structure of the prior art patent discussed above in particular, relates to the carrier gas which contains the atoms of the deposition materials. As the gas, which may be referred to as a reactant gas, flows over the surfaces of the substrate and the susceptor, deposition of the materials results in changes in the concentration of the deposition materials in the carrier gas. Consequently, as the reactant gas flows across or over the length of these relatively large susceptors, across each individual substrate and across a multiplicity of such substrates, different rates of growth of the deposited layer of material have been found. A second problem is that of temperature control which is critical at the elevated temperatures needed for proper deposition. It is difficult, if not impossibe, to control the temperature within the critical tolerances at all the desired locations within the relatively large reaction chambers. This results in different deposition layer thicknesses from one substrate to another, and can even produce varying thickness within the individual substrates. Still another problem is contamination which can result from various factors such as the handling techniques used to load and unload the substrates, the reactant and carrier gas, and indeed from the reaction chamber itself. The reactant gas not only deposits the deposition material on the substrate, but also on the walls of the reaction chamber. In the relatively large reaction chambers required for multi-substrate processing, the unwanted wall deposits can be inadvertently incorporated into the layers being deposited on the substrates.

These problems and drawbacks, as well as other factors, all contribute to significant problems as the semiconductor devices and the uses to which they are put become more sophisticated. As a result, many changes and improvements have been made in the equipment that is used to simultaneously process a multiplicity of substrates. For example, some equipment manufactuers are now using automated loading and off-loading devices to eliminate, or at least substantially reduce, contamination resulting from human handling. Obviously this and other things which are being done to improve the simultaneous multi-substrate processing techniques have helped. However, there are practical limits which many feel will ultimately make the simultaneous multi-substrate processing techniques unacceptable or at least undersirable. One of the limitations is that of the equipment being adaptable for handling larger diameter substrates. The economics of larger diameter substrates are causing many manufactures of semiconductor devices to use larger substrates. However, increasing the size of the substrate is causing some problems with regard to temperature differentials across the substrate, decreasing concentrations of the deposition materials as it is carried across the substrate, and the like.

Therefore, steps are being taken now by some equipment manufacturers to make suitable single substrate processing equipment which is significantly simpler in so far as controlling the various factors involved in chemical vapor deposition. Single substrate chemical vapor deposition equipment becomes inherently more desirable than multi-substrate equipment as the manufacturers of semiconductor devices change to larger substrates, i.e. 6 to 8 inches in diameter or even larger. One important consideration is the cost at risk when processing one substrate as opposed to the simultaneous multi-substrate processing. That is, if something goes wrong, the monetary loss is far less with one substrate that it is with a plurality of substrates.

In commonly owned copending U.S. patent applications: Ser. No. 032,474, filed on Mar. 31, 1987, entitled A ROTATABLE SUBSTRATE SUPPORTING MECHANISM WITH HEAT SENSING DEVICE FOR USE IN CHEMICAL VAPOR DEPOSITION EQUIPMENT; Ser. No. 148,630, filed on May 11, 1987, entitled WAFER HANDLING SYSTEM WITH BERNOULLI PICK-UP; Ser. No. 065945, filed on June 24, 1987 entiltled IMPROVED REACTION CHAMBERS FOR CVD SYSTEMS; each of which is incorporated herein by reference, a new and improved single substrate processing system is disclosed. To the best of our knowledge, no prior art heating system exists or has been devised which is suitable for use in the processing system disclosed in our copending U.S. patent applications.

SUMMARY OF THE INVENTION

In the commonly owned copending U.S. patent applications, which are incorporated herein by reference as detailed above, the chemical vapor deposition system includes a special horizontal flow reaction chamber having a bottom surface with a tubular shaft depending therefrom. A circular susceptor for supporting a single substrate is disposed within the reaction chamber on a driveshaft assembly which axially depends from the susceptor through the depending tubular shaft of the reaction chamber. The driveshaft assembly is rotatably drivable for rotation of the susceptor and thus the single substrate supportable thereon. The critical temperatures at various points of the susceptor are sensed by a special temperature sensing arrangement which includes a master temperature sensor which extends axially through the driveshaft assembly into the vicinity of the center of the susceptor. A special fixed ring, i.e. non-rotatable, is located in the reaction chamber in concentric relationship with the rotatable susceptor. At least one, and preferably three or more slave temperature sensors are located in the fixed ring for sensing the temperatures at various points near the periphery of the circular susceptor. The temperature sensors, that is the master temperature sensor located in the susceptor and the slave temperature sensors located in the fixed ring, all produce signals indicative of the temperatures sensed thereby. These signals are transmitted to a suitable control means which compares them to a predetermined set point temperature and produces signals which are coupled to the special heating system of the present invention for controlled operation thereof.

In accordance with the present invention, the heating system includes a top heating element assembly which is disposed above the reaction chamber and a bottom heating element assembly which is located below the reaction chamber, and a heat concentrator means. The top, or upper, heating element assembly includes a housing having a plurality of elongated tube-type radiant heating elements mounted therein so as to lie on horizontal axes which are in the preferred embodiment coincident with the direction of the reactant gas flow through the reaction chamber. The housing includes a special combination of planar and curved reflective surfaces to provide a particular heat radiation pattern which is ideally suited for the circular susceptor and fixed temperature sensor ring of the chemical vapor deposition system.

The bottom, or lower heating element assembly, includes a housing having a plurality of elongated tube-type radiant heating elements mounted therein so as to lie along horizontal axes which are likewise in the preferred embodiment transverse to the direction of the reactant gas flow through the reaction chamber. The housing includes a special combination of planar and curved reflective surfaces which cooperate with the elongated tube-type radiant heating elements to provide a heat radiation pattern which is ideal for use with the circular susceptor and the fixed concentric temperature ring of the processing system. The housing has a central opening formed therethrough and the tubular shaft of the reaction chamber, and thus the susceptor driveshaft assembly, extend downwardly through that opening.

The radiant heat concentrator means is mounted on the housing of the lower heating element assembly proximate the central opening thereof for directing concentrated radiant heat energy toward the center of the susceptor. Such concentrated directing of the radiant heat in the center of the susceptor compensates for heat losses at that point due to the depending tubular shaft of the reaction chamber and the susceptor driveshaft assembly which is axially disposed in the tubular shaft. In addition, the radiant heat concentrator means in combination with selected heat input zones of the upper and lower heating element assemblies provides a temperature controlling capability which allows a rapid build-up in the temperature of the susceptor at the beginning of a deposition cycle and a rapid temperature attenuation of the temperature at the end of a deposition cycle. At the start of a deposition cycle, the heat radiated by the concentrator means and the selected heat input zones of the upper and lower heating element assemblies is increased to raise the temperatue at the center of the susceptor and at the end of a cycle the heat radiated by the concentrator means is decreased to lower the temperature at the center of the susceptor. The master temperature sensor which is proximate the center of the susceptor produces signals indicative of the changes in temperature and the control circuitry means reacts to those signals by appropriately changing the radiant heat output of the other heat input zones of the upper and lower heating element assemblies. The slave temperature sensors located about the periphery of the susceptor in the fixed ring react to the temperature changes resulting from the changes in the heat output of the other heat input zones of upper and lower heating element assemblies by producing signals which are fed back into the control circuitry means which, in turn, controls those other heat input zones of the upper and lower heating elements to provide a balancing effect, i.e. a uniform temperature profile in the substrate, or wafer throughout the processing cycle.

Accordingly, it is an object of the present invention to provide a new and improved heating system for the reaction chamber of chemical vapor deposition equipment.

Another object of the present invention is to provide a new and improved heating system for use in a horizontal flow reaction chamber having a rotatably driven circular susceptor mounted therein with a master temperature sensor proximate the center of the susceptor and slave temperature sensors mounted at various points about the susceptor in a non-rotating ring which is concentric with respect to the susceptor.

Another object of the present invention is to provide a new and improved heating system for the preferred use discussed above with the heating system including an upper heating element assembly located above the reaction chamber, a lower heating element assembly below the reaction chamber and a heat concentrator means for directing concentrated heat at the center of the rotatable susceptor.

Another object of the present invention is to provide a new and improved heating system of the above described character wherein the upper heating element assembly preferably includes a plurality of elongated tube-type radiant heating elements which are disposed to lie along axes which are parallel with the flow of reactant gas through the reaction chamber and interact with a special configuration of planar and curved reflective surfaces to provide a heat radiation pattern which is ideally suited for use with the rotatably drivable circular susceptor.

Another object of the present invention is to provide a new and improved heating system of the above described character wherein the lower heating element assembly preferably includes a plurality of elongated tube-type radiant heating elements which are disposed to lie along axes which are transverse to the flow of reactant gas through the reaction chamber and interact with a special configuration of planar and curved reflective surfaces to provide a radiation heat pattern which is ideally suited for use with the rotatable circular susceptor.

Another object of the present invention is to provide the above discussed heating system wherein the upper and lower heating element assemblies and the concentrator means interact with the master and slave temperature sensors and with a control circuit means for producing a flat temperature profile of the substrate suspportable on the susceptor.

The foregoing and other objects of the present invention as well as the invention itself may be more fully understood from the following description when read in conjunction with the accompanying drawings.

DESCRIPTION OF THE PREFERRED EMBODIMENT

As will become apparent form the following description, the heating system of the present invention is ideally suited for use with a particular chemical vapor deposition system which is fully disclosed in the copending patent applications which are incorporated herein by reference as detailed above. In order to provide a clear understanding of this invention, a brief description of the parts of the system which are pertinent to this invention will now be presented.

Figure 1:
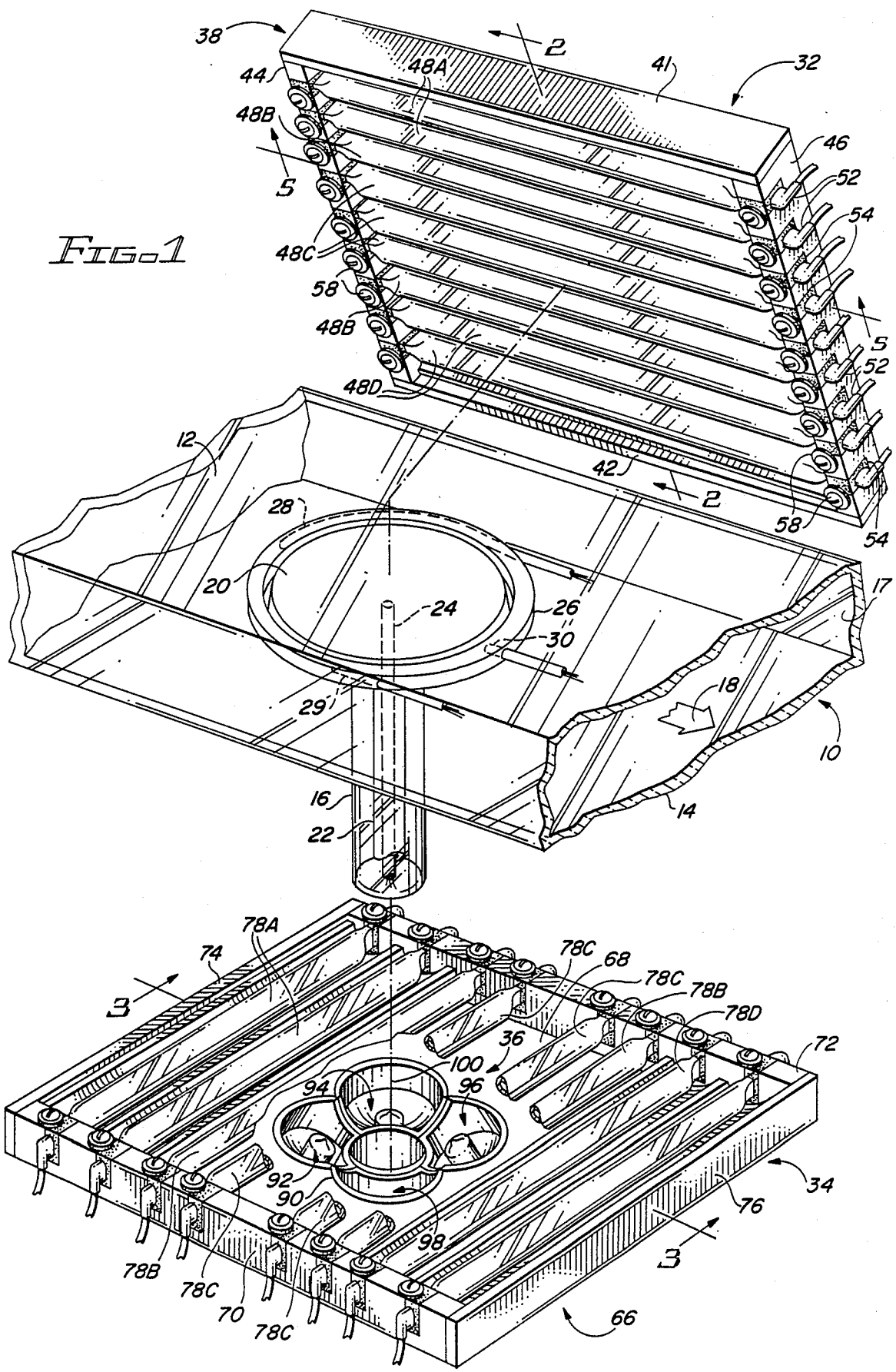
FIG. 1 is a perspective view of the heating system of the present invention which is shown in exploded relationship with the specialized reaction chamber, rotatable circular susceptor and a temperature sensing arrangement of a particular chemical vapor deposition system.

As described in detail in copending U.S. patent application, Ser. No. 065945, filed on June 24, 1987, entitled IMPROVED REACTION CHAMBERS FOR CVD SYSTEMS; the system as indicated in FIG. 1 includes a reaction chamber 10 of the horizontal flow type which is formed of a material which is transparent to radiant heat energy such as fused quartz. The reaction chamber 10 includes a planar top wall 12, a planar bottom 14 with a tubular shaft 16 depending therefrom, and the chamber defines a gas flow passage 17. A reactant gas is caused to flow the reaction chamber 10 in a direction indicated by the arrow 18 for the purpose of depositing materials on a substrate 19 (FIGS. 2 and 3) which is placed in the reaction chamber at the beginning of a deposition cycle and is removed therefrom after the cycle is completed.

As described in copending U.S. patent application, Ser. No. 032,474, filed on Mar. 31, 1987, for ROTATABLE SUBSTRATE SUPPORTING MECHANISM WITH HEAT SENSING DEVICE FOR USE IN CHEMICAL VAPOR DEPOSITION EQUIPMENT, a substrate is supported on a platform-like structure which is commonly referred to in the art as a susceptor which is indicated herein by the reference numeral 20. The susceptor 20 is circular and is supported on and rotatably driven by means of a driveshaft assembly 22 which extends downwardly from the reaction chamber 10 coaxially through the tubular shaft 16 of the reaction chamber 10. A temperature sensing arrangement is provided as part of the substrate supporting mechanism which includes a master temperature sensor 24 that extends axially upwardly through the driveshaft assembly 22 for sensing the temprature at the center of the susceptor 20 and producing signals indicative of the sensed temperature. A fixed, the is, non-rotating, ring 26 is also supported in the reaction chamber 10 in concentric relationship with the rotatable susceptor. The fixed ring 26 is configured to contain a plurality of slave temperature sensors, which in the illustrated embodiment, are shown as being three in number and are indicated by the reference numerals 28, 29 and 30. The slave temperature sensors 28, 29 and 30 are located to sense the temperatures at various points about the periphery of the susceptor 20 and produce signals indicative of the sensed temperatures.

As will hereinafter be described in detail, the heating system of the present invention includes the major components of an upper heating element assembly 32, a lower heating element assembly 34 and a heat concentrator means 36.

The upper heating element assembly 32 includes a generally rectangular housing 38 having a planar top wall 40, a spaced apart pair of sidewalls 41 and 42, and a spaced apart pair of endwalls 44 and 46 which cooperatively define a downwardly opening chamber. A plurality of elongated tube-type radiant heating elements 48A, 48B, 48C, and 48D, which are identified in this manner for reasons which will become apparent as this description progresses, are mounted in the downwardly opening chamber of the housing 38 and are disposed in spaced apart parallel relationship with respect to each other and lie on axes which are substantially parallel with respect to the reactant gas flow path through the reaction chamber 10.

Each of the elongated tube-type heating elements 48A, 48B, 48C, and 48D is preferably a high intensity tungsten filament lamp having a transparent quartz envelope which contains a halogen gas such as iodine. The elongated tube-type heating elements 48A, 48B, 48C, and 48D produce radiant heat energy of short wavelength, preferably on the order of one micron, and this energy is transmitted through the reaction chamber walls without appreciable absorption.

Although the lamps 48A, 48B, 48C, and 48D may be of different wattages, they are of similar configuration. Therefore, the following description of one of the lamps 48C and its mounting will be understood to apply to the other lamps as well.

Figure 5:
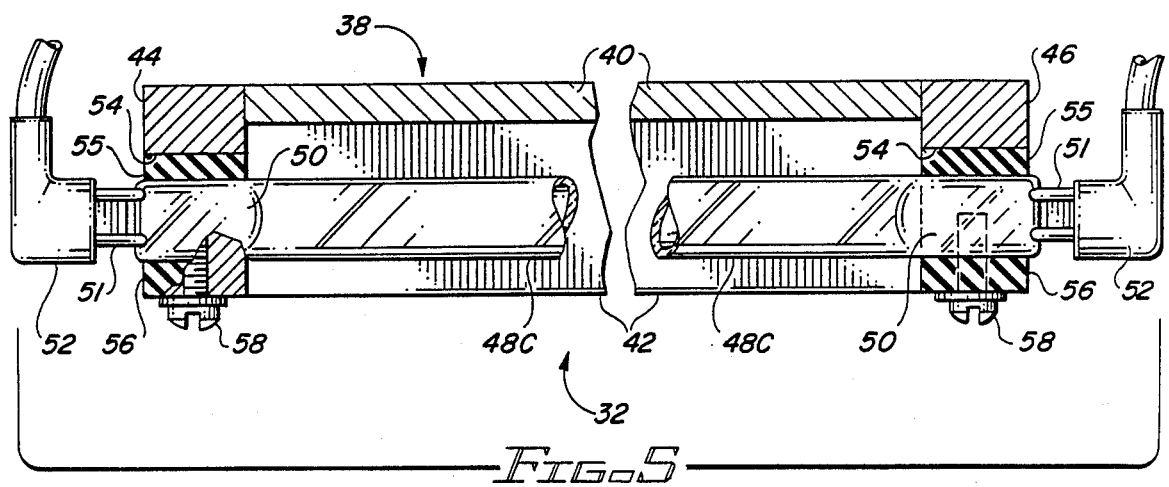
FIG. 5 is an enlarged fragmentary sectional view taken along the line 5—5 of FIG. 1.

As seen best in FIG. 5, the elongated tube-type heating lamp 48C has an integrally formed axially extending lug 50 on each of its opposite ends and a suitable connection pin arrangement 51 extends from each of the lugs for receiving connectors 52 that are provided on the ends of suitable electric wires. The endwalls 44 and 46 of the housing 38 are formed with downwardly opening slots 54 through which the lugs 50 of the lamp 48C extend, and suitable shock pads 55 and 56 are mounted in the slots above and below the lugs. The lugs 50 and the shock pads 55 and 56 are demountably retained in their respective slots 54 by suitable fastener means 58, such as by means of the illustrated off-set screw-washer arrangement.

Figure 2:
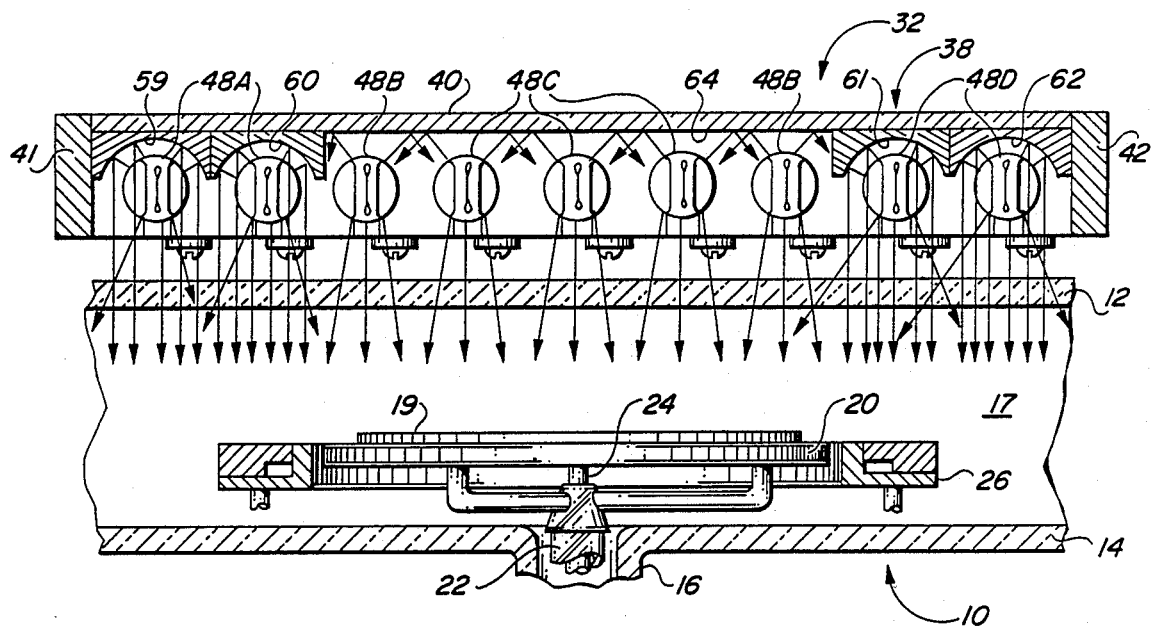
FIG. 2 is an enlarged sectional view along the line 2—2 of FIG. 1 to show the various features of the upper heating elements assembly and its relationship to the reaction chamber rotatable circular susceptor and temperature sensing arrangement of the deposition system.

As seen in FIG. 2, elongated linear concave reflective surfaces 59 and 60 which may be parabolic or elliptical segments in cross-section, are provided above the two radiant heat lamps 48A which are proximate the sidewall 41 of the housing 38 and two similar elongated linear concave reflective surfaces 61 and 62 are provided above the lamps 48D which are proximate the opposite sidewall 42 of the housing. The reflective surfaces 59, 60, 61 and 62 may be formed integral with the top wall 40 of the housing 38, or as shown, may be formed as separate elements which are welded or otherwise mounted in the housing 38. In any case, the elongated heat lamps 48A are located at the focal point of their concave reflective surfaces 59 and 60 so that the radiated heat energy which impinges on the concave reflective surfaces will be reflected into parallel paths as indicated by the arrows. Similarly, the heat lamps 48D are located at the focal points of their respective concave reflective surfaces 61 and 62 to produce parallel reflected rays of heat energy as indicated. The reflected parallel radiant heat energy is directed at and into the vicinity of the fixed temperature sensor ring 26 and cooperate with the directly radiated heat energy to concentrate radiated heat energy at and in the vicinity of the diametrically opposed lateral edges of the susceptor 20 to compensate for heat losses which inherently occur at the periphery of the susceptor 20, and of course at the peripheral edges of a substrate 19 supported on the susceptor.

The exposed planar portion of the inner surface 64 of the top wall 40 of the housing 38 is also highly reflective, such as by means of polishing, plating, or the like, so that both direct and reflected radiant heat energy from the elongated heating lamps 48B and 48C will pass through the top wall 12 of the reaction chamber 10 and impinge on the upper surfaces of the fixed temperature sensor ring 26, the susceptor 20, and of course on the substrate 19 supportable thereon. Thus, the radiant energy which is directed onto the substrate per se will be of a more diffuse nature than the concentrated energy directed onto the fixed ring.

The lower heating element assembly 34 is similar to the above described upper assembly 32 and includes a generally rectangular housing 66 having a planar bottom wall 68, a spaced apart pair of sidewalls 70 and 72 and a spaced apart pair of endwalls 74 and 76 which cooperatively define an upwardly opening chamber. A plurality of elongated tube-type radiant heating elements 78A, 78B, 78C and 78D, which are identified in this manner for reasons which will become apparent as this description progresses, are mounted in the upwardly opening chamber of the housing 66 and are disposed in spaced apart parellel relationship with respect to each other and lie on axes which are substantially transverse with respect to the reactant gas flow path through the reaction chamber 10 and are, therefore, transverse with respect to the heating lamps 48A-48D of the upper heating element assembly.

Each of the elongated radiant heating lamps 78A, 78B, 78C, and 78D may be identical with the above described lamps 48A-48D and thus are high intensity tungsten filament lamps having a halogen gas contained within transparent quartz envelopes. Further, the radiant heating lamps 78A-78D may be mounted in the housing 66 in the manner hereinbefore fully described with reference to the lamps 48A-48D, and it is deemed that repeating that description is unnecessary.

Figure 3:
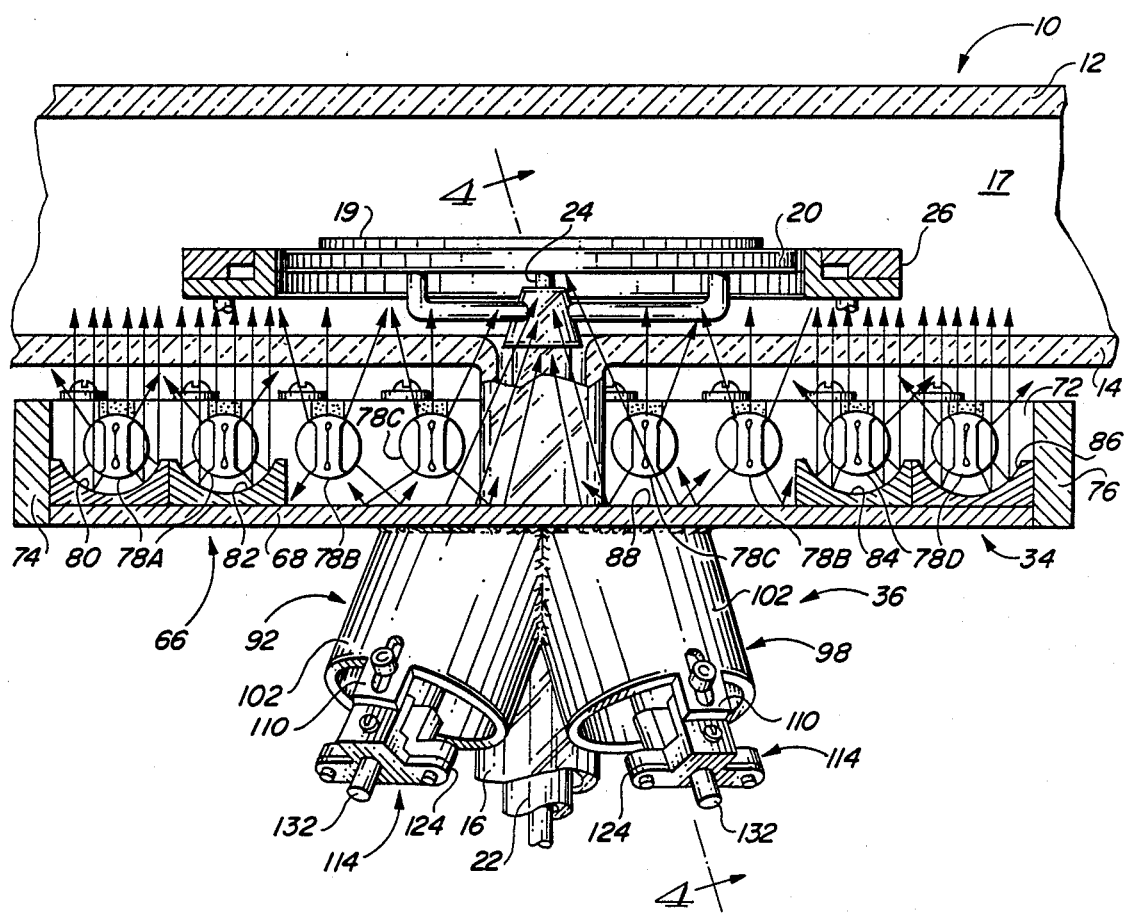
FIG. 3 is an enlarged sectional view taken along the line 3—3 of FIG. 1 to show the various features of the lower heater element assembly and the heat concentrator means and their relationship to the reaction chamber, the rotatable circular susceptor and the temperature sensing arrangement of the deposition system.

As shown in FIG. 3, elongated linear concave reflective surfaces 80 and 82, which may be parabolic or elliptical segments in cross-section, are provided immediately below the two heating lamps 78A which are proximate the endwall 74 of the housing 66 and two similar elongated linear concave reflective surfaces 84 and 86 are located below the two lamps 78D that are proximate the opposed sidewall 76 of the housing. The reflective concave surfaces 80, 82, 84, and 86 may be formed integrally in the bottom wall 68 of the housing 66 or may be formed as separate elements which are suitably mounted in the housing as shown. In any case, the reflective concave surfaces 80, 82, 84 and 86 cooperate with their respective heat lamps 78A and 78D which are located at the focal points of the surfaces, to produce parallel radiant heat energy which is reflected into the vicinity and onto the fixed ring 26 and cooperates with the directly radiated heat energy to concentrate the radiated heat energy at the diametrically opposed peripheral edges of the susceptor 20 which may be described as the upstream, or leading, edge of the susceptor and the downstream, or trailing, edge of the susceptor.

The exposed planar portion of the inner surface 88 bottom wall 68 of the housing 66 is also highly reflective so that both direct and reflected radiant heat energy from the heat lamp 78B and 78C are directed through the bottom wall 14 of the reaction chamber 10 for heating the fixed ring 26 and the susceptor 20. Thus, the radiant energy directed onto the lower surface of the susceptor will be diffuse.

In view of the above detailed description, it will be seen that radiant heat energy from the upper heating element assembly 32 will heat the temperature sensor ring 26, the susceptor 20 and the substrate 19 from the top, and the lower heating element assembly 34 will do the same from the bottom. Furthermore, by virtue of the elongated concave reflective surfaces 59, 60, 61 and 62 of the upper assembly 32, concentrated heating zones or regions are provided in the vicinity of the diametrically opposed side edges, i.e. those adjacent the sidewalls of the reaction chamber 10, of the ring 26, susceptor 20 and substrate 19. Similarly, by virtue of the elongated concave reflective surfaces 80, 82, 84, and 86 of the lower heating assembly 34, transverse concentrated heating zones, or regions are provided in the vicinity of the diametrically opposed front and back edges, i.e. those upstream and downstream of the reactant gas flow path through the reaction chamber 10, of the ring 26, susceptor 20 and the substrate 19.

The bottom wall 68 of the housing 66 is provided with a central opening 90 through which the depending tubular shfat 16, and thus the susceptor supporting driveshaft assembly 22, axially extend. Due to the depending tubular shaft 16 and the driveshaft assembly 22, there will be some inherent heat losses at the center of the susceptor 20. To compensate for this heat loss, and to provide temperature control as will hereinafter be described, the above mentioned radiant heat concentrator means 36 is provided.

The radiant heat concentrator means 36 preferably includes four identical heat focusing devices 92, 94, 96, and 98 which are located in equally spaced apart relationship with respect to each other about the vertical axis 100 (FIG. 4) defined by the central opening 90 of the lower housing 66 and the depending tubular shaft 16 of the reaction chamber 10. Each of the heat focusing devices 92, 94, 96 and 98 is suitably attached, such as by welding, to the bottom wall 68 of the lower housing 66 as will hereinafter be described in more detail.

Since the four radiant heat focusing devices 92, 94, 96, and 98 are identical, the following detailed description of the device 98 will be understood to also apply to the other devices 92, 94 and 96.

Figure 4:
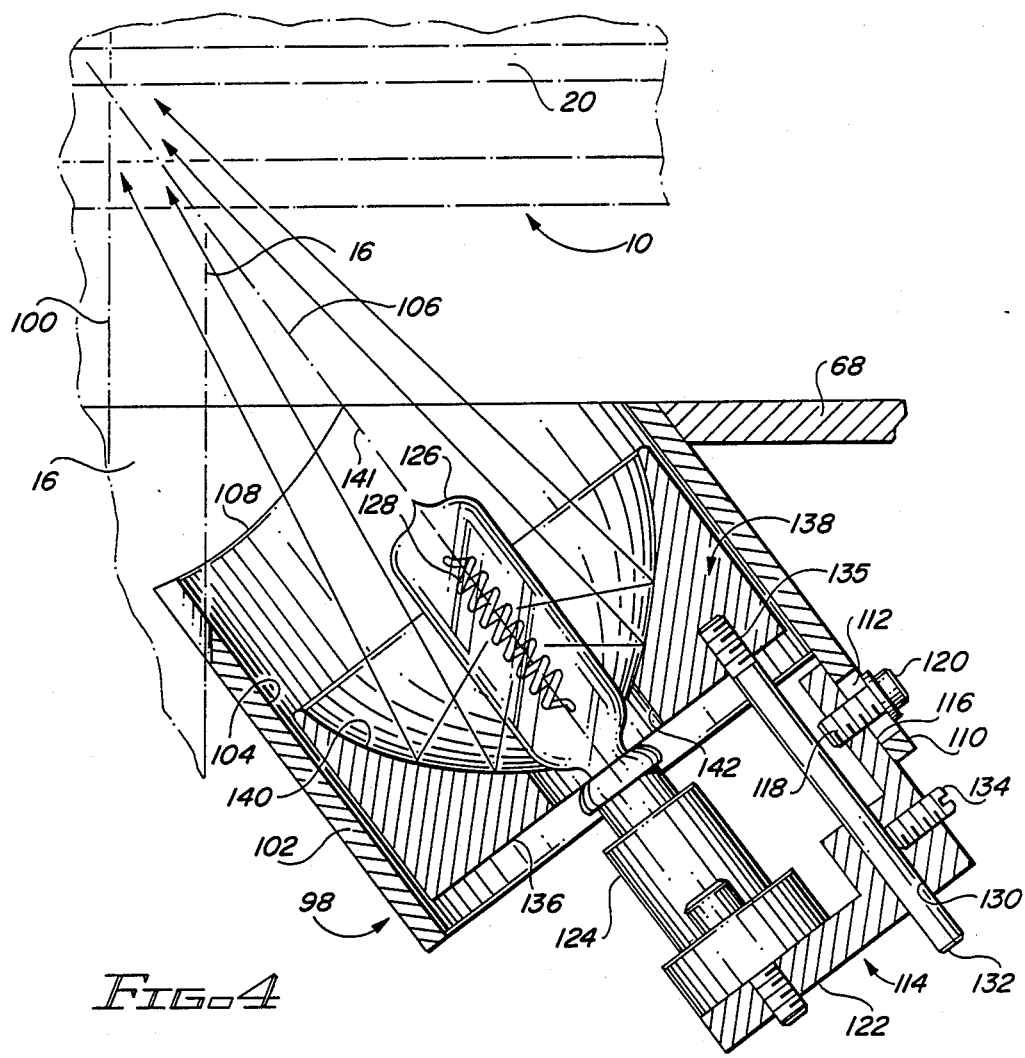
FIG. 4 is an enlarged fragmentary sectional view taken along the line 4—4 of FIG. 3.

As seen best in FIG. 4, the radiant heat focusing device 98 includes a cylindrical body 102 defining an open ended axial bore 104. The body 102 is disposed so that the axis 106 of the body forms an angle with respect to the vertical axis 100, with that angle being on the order of about 35°. The top end 108 of the body 102 is of irregular configuration so as to fit into the irregular opening 90 of the housing 66, provide a non-interfering fit with the similar bodies of the adjacent heating devices 92 and 96 and provide clearance for the depending tubular shaft 16 of the reaction chamber 10. The lower end of the cylindrical body 102 has an extending tail portion 110 with an elongated opening 112 formed therethrough. An L-shaped bracket 114 is provided with a first flange 116 having an internally threaded opening 118 for threadingly receiving a suitable fastener bolt 120 which secures the L-shaped bracket 114 to the tail portion 110 of the cylindrical 102. By virtue of the elongated opening 112 of the portion 110, the entire L-shaped bracket 114 can be adjustably moved axially toward and away from the cylindrical body 102. The L-shaped bracket 114 is also provided with a second flange or base 112 which lies in a plane transverse with respect to the axis 106 of the cylindrical body 102. A suitable lamp ssocket 124 is mounted on the base flange 122 so as to extend normally therefrom toward the axial bore 104 of the body 102. A bulb-type radiant heating element 126 is mounted in the socket 124 so as to extend axially upwardly into the bore 104 of the body 102. Therefore, the bulb-type heating element 126 is axially adjustable due to the hereinbefore described adjustable moving capability of the L-shaped bracket 114. The bulb-type radiant heating element is preferably a high intensity bulb having a tungsten filament 128 in a transparent quartz envelope which is filled with a suitable halogen gas.

The L-shaped bracket 114 is also provided with a bore 130 which is parallel to the axis 106 of the cylindrical body 102 and is laterally offset relative to the axis 106. A rod 132 is carried in the bore 130 for axial slidable movement therein and a suitable set screw 134 carried in the L-shaped bracket 114 is employed to releasably hold the rod 132 in a desired position. The rod 132 has a threaded upper end 135 which is threadingly mounted in a suitable threaded bore formed in the base 136 of a dish-shaped reflector 138. The reflector 138 is cylindrical and has a concave reflective surface 140, and defines a reflector axis 141 which is normal with respect to the base 136 and is coincident with the axis 106 of the body 102. The concave reflective surface 140 may be parabolic or elliptical, and opens onto its upper end. An opening 142 extends axially from the base 136 of the reflective surface 140, and the bulb-type radiant heating element 126 extends axially through the opening 140 up into the area defined by the concave reflective surface 140.

The bulb-type radiant heating element 126 is located so that its filament 128 lies along the reflector axis 141 proximate the focal point of the reflector 138 so that the radiant heat energy which impinges on the concave reflective surface 140 will be convergingly reflected as indicated by the arrows in FIG. 4. In that the focal point of the reflector 138 is a point, and the filament 128 of the bulb-type lamp 126 is linear, the entire source of radiant heat energy cannot physically lie on the focal point. Therefore, the convergingly reflected heat energy will not converge at a single point but will instead converge in an area which is larger than a single point in what may be described as a fuzzy concentration of radiated heat energy. As a result of such fuzzy concentration of radiated heat energy from each of the focusing devices 92, 94, 96, and 98, an area in and around the center of the susceptor 20 is the recipient of the concentrated heat energy, and the radiation concentration can be adjustably varied due to the axially adjustable capabilities of the refector 138 and the bulb-type radiant heating lamp 126.

Figure 6:
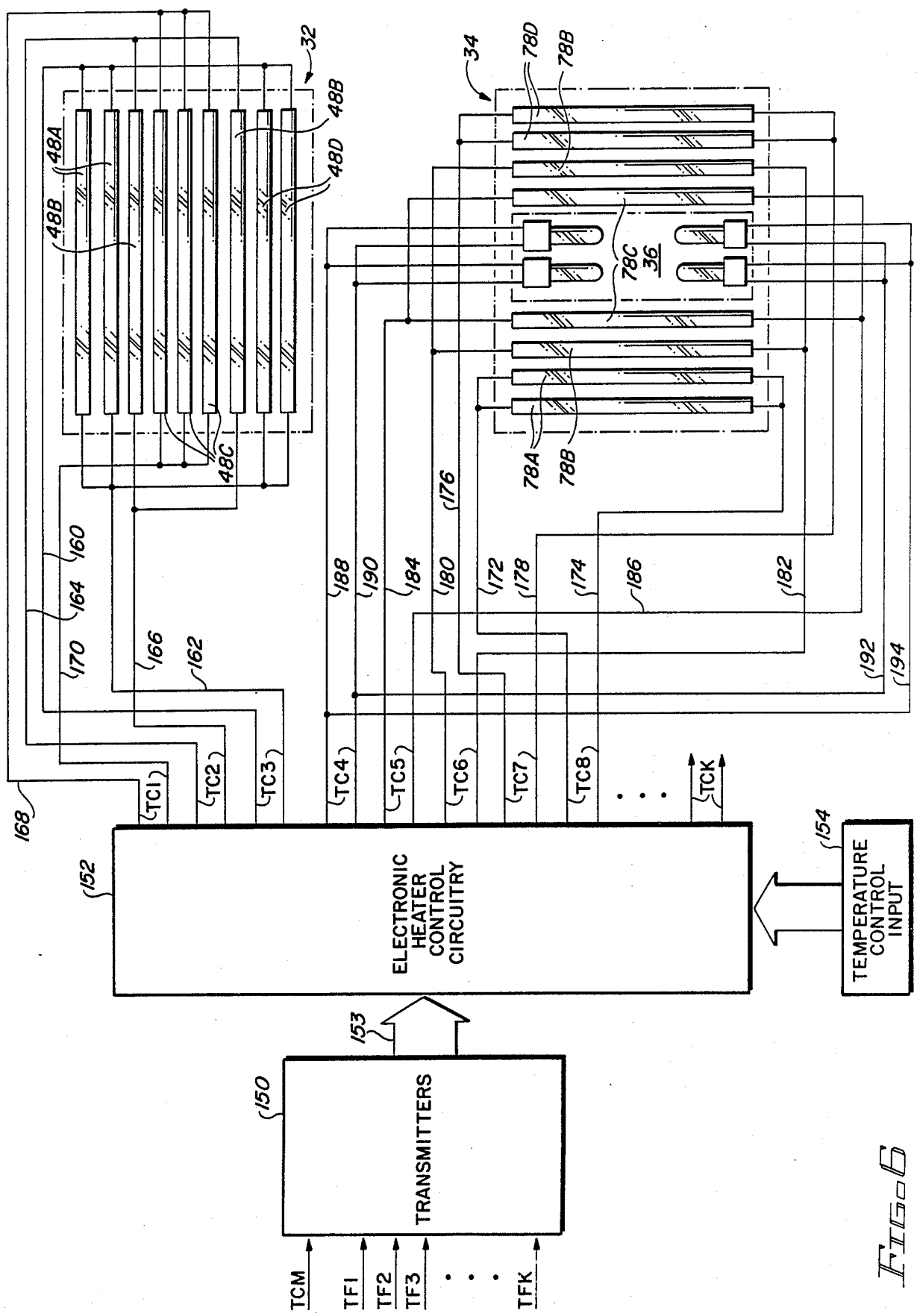
FIG. 6 is a diagrammatic view of the heating system of the present invention and also shows electrical connection to a suitable control circuit means.

Reference is now made to FIG. 6 wherein a schematic diagram is shown to illustrate a preferred manner of operation and control of the heating system of the present invention.

As hereinbefore briefly discussed, and fully described in the copending application Ser. No. 032,474, the master heat sensor 24 and the temperature follower, or slave, heat sensors 28, 29 and 30, sense the temperatures at various zones in and around the susceptor 20 and the temperature sensing ring 26, and produce signals indicative of those sensed temperatures. The signals from the master temperature sensor 24 are directed to suitable transmitter circuitry shown as block 150 as indicated at TMC in FIG. 6. Similarly, the temperature sensors 28, 29 and 30, which may vary in number as desired or needed, are supplied as inputs TF1, TF2, TF3, ... TFK, to the transmitter circuitry of block 150. The transmitter circuitry of block 150 contains suitable well known components and circuits, such as amplifiers (not shown), for transmitting the temperature indicative signals to an electronic heater control 152 as indicated by the data transfer arrow 153.

The electronic heater control which is shown in the form of the block 152, may include any conventional type of master-slave heater control circuitry as is well known in the art, which would typically include a power supply, a plurality of lamp driver circuits, and a plurality of differential amplifiers with selectively alterable offset controls.

Temperature control information, such as data indicating the starting and finishing of a vapor deposition cycle, the desired operating temperature at which the deposition is to be accomplished and the like, may be supplied to the electronic heater control of block 152 from a temperature control means shown in the form of block 154.

As will hereinafter be described in detail, the electronic heater control of block 152 receives data from the temperature control means 154 and the signals from the temperature sensors 24, 28, 29 and 30 and generates a plurality of control signals which appropriately provide additional power or remove power from the upper and lower heating element assemblies 32 and 34, and the concentrator means 36 for precise control of heating of the susceptor.

In that the various temeprature sensors 24, 28, 29, and 30 sense temperatures in various zones in the reaction chamber 10, the radiant heat input of the upper and lower heating element assemblies 32 and 34, and the heat concentrator means 36, are preferably connected and operated in a manner which provides individually controllable zones of radiant heating energy input.

As seen in FIG. 6, the four elongated tube-type radiant heating elements 48A and 48D of the upper heating element assembly 32 have their opposite end terminals ganged together by conductors 160 and 162 so that they are operated as an entity by control signals TC-3 produced by the heater control 152. Thus, the four elements 48A and 48D provide two physically spaced apart commonly controlled heating zones which are disposed proximate the opposite sidewalls of the reaction chamber 10 with the zones extending parallel to the reactant gas flow path to provide heating of the opposed lateral edges of the temperature sensing ring 26 and the susceptor 20. The two elongated tube-type radiant heating elements 48B have their opposite end terminals ganged together by conductors 164 and 166 and are thus controlled as an entity by the output signals TC-2 from the heater control 152. Therefore, the two elements 48B provide two more physically separated heating zones which are controlled as a single entity with these zones extending in parallel relationship with the reactant gas flow path and being disposed between the zones established by the elements 48A and 48B and on opposite sides of the center of the susceptor 20. The three elongated tube-type radiant heating elements 48C are also connected to operate as a single entity by having their end terminals connected in a ganged manner by conductors 168 and 170 so that the control signals TC-1 produced by the heater control 152 will operate those elements. These centrally located heating elements 48C provide a single central zone of radiant heating energy input which extends across the temperature sensor ring 26 and the susceptor 20 in an extending path which is parallel to the reactant gas flow path through the reaction chamber 10.

The lower heating element assembly 34 has the end terminals of the two elongated tube-type radiant heating elements 78A thereof ganged together by conductors 172 and 174 so that they operate as a single entity under control of the output signals TC-7 of the heater control 152. Thus, the two elements 78A provide a single individually controllable zone of radiant heat energy input which extends transversely of the reaction chamber below the leading edges of the temperature sensor ring 26 and the susceptor 20. Similarly, the two elongated tube-type radiant heating elements 78D have their end terminals ganged together by the conductors 176 and 178 so as to operate as an entity under control of the output signals TC-7 of the heater control 152. Therefore, the two elements 78D provide a single individually controllable zine of radiant heat energy input which extends transversely across the reaction chamber 10 below the trailing edges of the temperature sensing ring 26 and the susceptor 20. As hereinbefore mentioned, the leading edges of the ring 26 and the susceptor 20 are herein defined as those edges which are upstream in the reactant gas flow path and the trailing edges are those which are downstream in the reactant gas flow path.

The two elongated tube-type heating elements 78B of the lower heating element assembly 34 have their end terminals ganged together by means of the conductors 180 and 182 so that they are operably controlled as an entity by the output signals TC-6 of the heater control 152. Therefore, the two elements 78B provide two spaced apart transversely extending heating zones which are controlled in unison, with one of those zones being adjacent and immediately downstream of the leading edges of the temeprature sensor ring 26 and the susceptor 20, and the other zone being immediately upstream of trailing edges thereof. Similarly, the two elongated tube-type radiant heating elements 78C have their end terminals ganged together by conductors 184 and 186 and are thus controlled as a single entity by the output signals TC-5 of the heater control 152. Therefore, the two heating elements 78C provide two physically spaced apart transversely extending heating zones which are commonly controlled and are disposed on opposite sides of the center of the susceptor 20.

The bulb-type radiant heating elements 126 of the heat concentrator means 36 have their respective terminals gang coupled by conductors 188, 190, 192 and 194 which are in turn coupled to receive the temperature control output signals TC-4 from the heater control 152. Thus, each of the radiant heat focusing devices 92, 94, 96 and 98 operate in unison to provide a concentrated heat energy receiving zone at the center area of the susceptor 20.

PREFERRED OPERATION

When an input signal is received from the temperature control input means 154 to indicate the start of a deposition cycle, the heater control means 152 responds by applying full power to the heat focusing devices 92, 94, 96 and 98 of the heat concentrator means 36, to the heating elements 48B, 48C of the upper heating assembly 32 and to the heating elements 78B, 78C of the lower heating assembly 34. That same input signal contains information indicative of a desired operating temperature at which the deposition cycle is to be accomplished. The application of full power to the heat concentrator means 36 and to the selected heating elements of the heating assemblies 32 and 34 produces a rapid rise in the temperature in the central area of the susceptor 20, and of course, in the central area of the substrate 19 being processed. The master temperature sensor 24 senses the rapid rise in temperature and sends signals indicative thereof to the heater control means 152 which compares the sensed temperature with the desired operating temperature and adjusts the power supplied to the concentrator means 36 and the selected heating elements of the heating assemblies 32 and 34 to produce and maintain the desired operating temperature in the central area of the susceptor 20 and substrate 19.

The sensed temperature signals produced by the master temperature sensor 24 are also used simultaneously by the heater control means 152 to apply power to the other alongated tube-type radiant heating elements 48A, 48D, 78A and 78D of the upper and lower heating element assemblies 32 and 34 respectively. Thus, while the temperature in the central areas of the susceptor 20 and the substrate 19 and being brought up to the desired operating temperature, the temperatures about the periphery of the susceptor and in temperature ring 26 are simultaneously being brought up to temperature by the heating elements 48A, 48D, 78A and 78D of the upper and lower heating element assemblies 32 and 34 in what may be described as a following operation. The increasing temperatures in the peripherally located heating zones or regions are sensed by the slave temperature sensors 28, 29 and 30, and additional sensors if desired, and the slave temperature sensors produce signals indicative of the sensed temperatures. The signals received by the heater control means 152 from the slave temperature sensors 28, 29, and 30, are compared with the signal received from the master temperatue sensor 24 to adjust the power to the elongated tube-type heating elements 48A, 48D, 78A and 78D to bring the temperatures in the peripherally located heating zones into alignment with the temperature in the central area of the susceptor 20 and the substrate 19.

Due to variables such as heat losses at the peripheral edges of the substrate 19 and the susceptor 20, the flow of reactant gas through the reaction chamber 10, and the like, the heating elements 48A, 48D, 78A and 78D may be ideally set to normally operate at temperatures which are offset, i.e. different than the desired operating temperature in the central area of the substrate 19 and the susceptor 20. And, the process of sensing temperatures and adjusting the power applied to the various groups, or banks of heating elements as needed, is continued throughout the deposition cycle. The object of all this is, of course to provide a uniform, or flat temperature gradiant in all of the relevant areas of the substrate, susceptor and temperature sensing ring throughout the deposition cycles. And in the interests of production time, to bring the system up to temperature as fast as possible at the beginning of a cycle and cool it down when a cycle is completed. The rapid increasing of temperatures at the beginning of a cycle, as described above, is accomplished by the concentrator means 36 and selected heating elements of the heating assemblies 32 and 34 in combination with the master-slave temperature sensor arrangement which effectively produced the temperature following mode of operation. Cooling the system down at the end of a cycle is accomplished by reversing the above heating-up procedure. In other words, the power applied to the concentrator means 36 and the selected heating elements proximate the center of the heating assemblies 32 and 34 is reduced and the temperature in the peripherally located heating zones will follow along with the reduction of heat at the center areas of the substrate 19 and the susceptor 20.

While the principles of the invention have now been made clear in the illustrated embodiments, there will be immediately obvious to those skilled in the art, many modifications of structure, arrangements, proportions, the elements, materials and components used in the practice of the invention and otherwise, which are particularly adapted for specific environments and operation requirements without departing from those principles. The appended claims are therefore intended to cover and embrace any such modifications within the limits only of the true spirit and scope of the invention.

What we claim is:

1. A heating system for use with chemical vapor deposition equipment said heating system comprising:
   (a) a reaction chamber for receiving a gas flow in a horizontal flow path, said reaction chamber including a planar top wall and an planar bottom wall, a tubular shaft depending from said bottom wall and a susceptor supporting and rotating mechanism extending through said tubular shaft;
   (b) a rotatable susceptor secured to said susceptor supporting and rotating mechanism for supporting a substrate and upon which substrate the gas flow deposits materials;
   (c) upper heating element means placed in upwardly spaced overlaying relationship with said top wall of said reaction chamber for directing heat energy downwardly onto said susceptor and into the area proximate the periphery of said susceptor and onto the substrate supported thereon;
   (d) lower heating element means placed in downwardly spaced underlying relationship with said bottom wall of said reaction chamber for directing heat energy upwardly onto said susceptor and into the area proximate the periphery of said susceptor; and
   (e) heat concentrator means for placement beneath said reaction chamber in the proximity of said tubular shaft for directing concentrated heat energy upwardly into the area at the center of said susceptor.

2. A heating system as claimed in claim 1 wherein said upper heating element means includes a plurality of spacedly arranged elongated radiant heating elements.

3. A heating system as claimed in claim 1 wherein said upper heating element means includes a plurality of spacedly arranged elongated radiant heating elements disposed along axes parallel with the reactant gas flow path through said reaction chamber.

4. A heating system as claimed in claim 1 wherein said upper heating element means includes a plurality of spacedly arranged elongated radiant heating elements each of said elongated radiant heating element being a high intensity tungsten filament tube-type lamp contained in a transparent envelope filled with a halogen gas.

5. A heating system as claimed in claim 1 wherein said upper heating element means comprises a plurality of spacedly arranged elongated radiant heating elements disposed on axes parallel with respect to the reactant gas flow path through said reaction chamber, said plurality of radiant heating elements being arranged and electrically interconnected to provide at least two independently controllable banks of radiant heating elements.

6. A heating system as claimed in claim 5 including elongated linear concave reflector means associated with one bank of said banks of radiant heating elements for reflectively directing concentrated radiant heat energy from said one bank into said reaction chamber.

7. A heating system as claimed in claim 1 wherein said upper heating element means comprises:
   (a) a housing defining a downwardly opening chamber;
   (b) a plurality of elongated radiant heating lamps mounted in spaced side-by-side positions in said chamber
   (c) first electric means connected to at least one heating lamp of said plurality of heating lamps for controlling its radiant enerny output, said one heating lamp being located in the center of said plurality of heating lamps to provide an independently controllable central zone of radiant heat energy output;

(d) second electric means interconnecting at least a first pair of heating lamps of said plurality of heating lamps for controlling their radiant energy output, each said heating lamp of said first pair of heating lamps being disposed on a different opposite side of said one heating lamp to provide a pair of intermediately located zones of radiant energy output which are independently controllable as an entity; and (e) third electric means interconnecting at least a second pair of heating lamps of said plurality of heating lamps for controlling their radiant energy output, each said heating lamp of said second pair of heating lamps being disposed at a different opposite end of said plurality of heating lamps to provide a pair of end zones of radiant heat energy output which are independently controllable as an entity.

8. A heating system as claimed in claim 7 and further comprising:

(a) at least a pair of elongated concave reflector means, each of said concave reflector means being disposed above a different one of said second pair of heating lamps for reflectively directing some of the radiant heat energy output into concentrated radiant heat energy output;

(b) said housing including a top wall; and (c) a reflective planar surface disposed on said top wall of said housing above said one heating lamp and said first pair of heating lamps of said plurality of radiant heating lamps for reflectively directing some of the radiant heat energy.

9. A heating system as claimed in claim 1 wherein said lower heating element means includes a plurality of spacedly arranged elongated radiant heating elements.

10. A heating system as claimed in claim 1 wherein said lower heating element means includes a plurality of spacedly arranged elongated radiant heating elements disposed along axes transverse to the reactant gas flow path through said reaction chamber.

11. A heating system as claimed in claim 1 wherein said lower heating element means includes a plurality of spacedly arranged elongated radiant heating lamps, each said elongated radiant heating element being a high intensity tungsten filament tube-type lamp contained in a transparent envelope filled with a halogen gas.

12. A heating system as claimed in claim 1 wherein said lower heating element means includes a plurality of spacedly arranged elongated radiant heating elements disposed on axes transverse with respect to the reactant gas flow path through said reaction chamber, said plurality of radiant heating elements being arranged and electrically interconnected to provide at least three independently controllable banks of radiant heating elements.

13. A heating system as claimed in claim 12 including elongated concave reflector means associated with two banks of said banks of radiant heating elements for directing reflectively concentrated radiant heat energy from each said bank of said two banks into said reaction chamber.

14. A heating system as claimed in claim 1 wherein said lower heating element means comprises:

(a) a housing having a bottom wall and defining an upwardly opening chamber, said housing having an opening formed centrally through the bottom wall and through which said tubular shaft extends when said housing is disposed below said reaction chamber;

(b) a plurality of elongated radiant heating lamps mounted in spaced side-by-side positions in said housing;

(c) first electric means interconnecting at least a first pair of heating lamps of said plurality of heating lamps for controlling their radiant energy output, each said heating lamp of said first pair of heating lamps being disposed on a different opposite side of the central opening of said housing to provide an independently controllable central zone of radiant heat energy output;

(d) second electric means interconnecting at least a second pair of heating lamps of said plurality of heating lamps for controlling their radiant energy output, each said heating lamp of said second pair of heating lamps being disposed on a different opposite side of said first pair of heating lamps to provide a pair of intermediately located zones of radiant heat energy output which are independently controllable as an entity;

(e) third electric means connected to at least one heating lamp of said plurality of heating lamps for controlling its radiant energy output, said one heating lamp being located at one end of said plurality of heating lamps to provide an independently controllable first end zone of radiant heat energy output; and (f) fourth electric means connected to at least an other heating lamp of said plurality of heating lamps for controlling its radiant energy output, said other heating lamp being located at the other end of said plurality of heating lamps to provide an independently controllable second end zone of radiant heat energy output.

15. A heating system as claimed in claim 14 and further comprising:

(a) first elongated concave reflector means disposed below said one heating lamp of said plurality of heating lamps for reflectively concentrating some of the radiant heat energy output therefrom;

(b) second elongated concave reflector means disposed below said other heating lamp of said plurality of heating lamps for reflectively concentrating some of the radiant heat energy output therefrom; and (c) a reflective planar surface disposed on the bottom wall of said housing below said first and second pairs of heating lamps of said plurality of heating lamps for reflecting some of the radiant energy therefrom.

16. A heating system as claimed in claim 1 wherein said heat concentrator means comprises at least one heat focusing device having a radiant heating element and a reflector means for convergingly concentrating the radiant heat energy output of said radiant heating element.

17. A heating system as claimed in claim 1 wherein said heat concentrator means comprises at least a pair of heat focusing devices placed on diametrically opposed sides of said tubular shaft, each of said pair of heat focusing devices, each said pair of heat focusing devices including a radiant heating element and a reflector means for convergingly concentrating the radiant heat energy output of said radiant heating element.

18. A heating system as claimed in claim 17 wherein each said heat focusing device of said pair of heat focusing devices further comprises means for mounting said radiant heating element and said reflector means to direct angularly and upwardly into the central area of the susceptor the concentrated radiant heat energy when said heat focusing device is located below said reaction chamber.

19. A heating system as claimed in claim 1 wherein said heat concentrator means comprises:
  (a) at least a pair of heat focusing devices placed on diametrically opposed sides of said tubular shaft of said reaction chamber, each of said heat focusing devices including,
    I. a dish-shaped reflector having a base and a reflector axis extending normally therefrom, and a concave reflective surface which defines a focal point that lies on the reflector axis;
    II. a radiant heating lamp having a filament,
    III. means for mounting said heating lamp to place at least a portion of its filament at the focal point of said reflector, and
    IV. means for mounting said reflector to place its reflector axis directed angularly and upwardly toward the center of said susceptor which said focusing device is disposed below said reaction chamber.

20. A heating system as claimed in claim 19 wherein the filament of said radiant heating lamp is linear and is disposed along the reflector axis of said dish-shaped reflector.

21. A heating system as claimed in claim 19 wherein said means for mounting said heating lamp is adjustable for moving said heating lamp ralative to said reflector along the reflector axis thereof.

22. A heating system as claimed in claim 19 wherein said means for mounting said reflector is adjustable for moving said reflector toward and away from said reaction chamber when said focusing device is located below said reaction chamber.

23. A heating system as claimed in claim 1 and further comprising:
  (a) said lower heating element means including,
    I. an upwardly open housing having a bottom wall through which a central opening is formed for receiving said tubular shaft when said lower heating element means is placed below said reaction chamber,
    II. said lower heating element means comprising a plurality of elongated radiant heating lamps mounted in side-by-side positions in said upwardly open housing; and
  (b) said heat concentrator means including at least a pair of heat focusing devices disposed in the bottom wall of said housing and on diametrically opposed sides of the central opening of said housing, each of said heat focusing devices including,
    I. a body having a bore which defines an axis, said body being mounted in the bottom wall of said housing with the bore of said body opening into said housing through the central opening thereof and defining an axis extending upwardly toward the center of said susceptor when said lower heating element means is placed below said reaction chamber,
    II. a dish-shaped reflector disposed in the bore of said body and having an upwardly opening concave reflective surface, a reflector axis extending upwardly and normally from the center of said reflective surface in coincident relationship with the axis of the bore of said body, said reflective surface having a focal point lying on the reflector axis, and
    III. a radiant heating bulb disposed in the bore of said body and lying along the reflector axis, said radiant heating bulb having a filament of which at least a portion is at the focal point defined by said reflective surface.

24. A heating system as claimed in claim 23 and further comprising means for mounting said dish-shaped reflector in the bore of said body said mounting means being adjustable for selective movement of said reflector toward and away from the central opening of said housing.

25. A heating system as claimed in claim 23 and further comprising means for mounting said radiant heating bulb in the bore of said body said mounting means being adjustable for selective movement of said radiant heating bulb along the reflector axis.

26. A heating system for use during a chemical vapor deposition process, said heating system comprising in combination:
  (a) a reaction chamber, said reaction chamber having a flow of reactant gas and carrier gas therethrough;
  (b) a susceptor disposed within said reaction chamber, said susceptor including a peripheral area, a top surface and a bottom surface;
  (c) a substrate disposed upon said susceptor during exercise of the chemical vapor deposition process to deposit materials upon said substrate, said substrate including a top surface and a peripheral area;
  (d) a first plurality of radiant heat energy sources having a first longitudinal axis for radiating heat upon the top surface of said substrate and said susceptor, said first plurality of sources including first means for concentrating radiant energy at diametrically opposed generally peripheral areas of said substrate and said susceptor;
  (e) a second plurality of radiant heat energy sources having a second longitudinal axis orthogonal to the first longitudinal axis for radiating heat upon the bottom surface of said susceptor, said second plurality of sources including second means for concentrating radiant energy at diametrically opposed generally peripheral areas of said susceptor;
  (f) radiant heat concentrator means, including a third source of radiant heat energy, for concentrating impingement of radiant heat energy upon the bottom surface of said susceptor;
  (g) means for sensing the temperature at a plurality of zones within said reaction chamber and for generator signals reflective of the temperatures sensed; and
  (h) control means responsive to the signals generated by said temperature sensing means for varying the radiant heat energy emitted by said first plurality of sources, said second plurality of sources and said heat concentrating means for establishing and maintaining said substrate at a uniform predetermined temperature during processing of said substrate.

27. The heating system as set forth in claim 26 wherein one of said first and second plurality of radiant heat sources is axially oriented parallel with the flow of the reactant gas and the carrier gas within said reaction chamber and the other of said first and second plurality of radiant heat sources is axially oriented transverse with the flow of the reactant gas and the carrier gas within said reaction chamber.

28. The heating system as set forth in claim 26 wherein said first plurality of radiant energy heat sources is oriented parallel with the flow of the reactant gas and the carrier gas within said reaction chamber and the second plurality of radiant energy heat sources is oriented transverse with the flow of the reactant gas and the carrier gas within said reaction chamber.

29. The heating system as set forth in claim 26 wherein said first concentrating means includes first and second means for directing radiant heat energy from said first plurality of radiant heat sources upon the opposed peripheral areas, respectively, of said suubstrate and said susceptor.

30. The heating system as set forth in claim 26 wherein said second concentrating means includes first and second means for directing radiant heat energy from said second plurality of radiant heat sources upon the opposed peripheral areas, respectively, of said susceptor.

31. The heating system as set forth in claim 30 wherein said first concentrating means includes first and second means for directing radiant heat energy from said first plurality of radiant heat sources upon the opposed peripheral areas, respectively, of said substrate and said susceptor.

32. The heating system as set forth in claim 31 wherein said first and second means of said first concentrating means and said first and second means of said second concentrating means comprises curved reflective surfaces for reflecting radiant heat energy impinging thereupon.

33. The heating system as set forth in claim 26 wherein said radiant heat concentrator means includes means for directing the radiant heat energy thereof toward said susceptor.

34. The heating system as set forth in claim 33 wherein said directing means comprises means for reflecting radiant heat energy impinging thereupon.

35. The heating system as set forth in claim 34 including means for varying the concentration of radiant heat energy reflected by said reflecting means.

36. The heating system as set forth in claim 26 wherein said sensing means includes means disposed in said susceptor.

37. The heating system as set forth in claim 26 wherein said control means includes means for adjusting the temperature profile within said reaction chamber.

* * * * *